(12) United States Patent
Skaling

(10) Patent No.: US 11,085,893 B2
(45) Date of Patent: Aug. 10, 2021

(54) CAPACITIVE MATRIX SUCTION SENSOR HAVING A HYDROPHILIC, NON-CONDUCTIVE, POROUS JACKET

(71) Applicant: Whitney Skaling, Buellton, CA (US)

(72) Inventor: Whitney Skaling, Buellton, CA (US)

( * ) Notice: Subject to any disclaimer, the term of this patent is extended or adjusted under 35 U.S.C. 154(b) by 200 days.

(21) Appl. No.: 16/579,109

(22) Filed: Sep. 23, 2019

(65) Prior Publication Data

US 2021/0088462 A1 Mar. 25, 2021

(51) Int. Cl.
*G01N 27/04* (2006.01)
*G01N 13/04* (2006.01)
*G01R 1/067* (2006.01)

(52) U.S. Cl.
CPC ........... *G01N 27/048* (2013.01); *G01N 13/04* (2013.01); *G01R 1/067* (2013.01)

(58) Field of Classification Search
CPC .... G01N 27/048; G01N 13/04; G01N 27/225; G01R 1/067
See application file for complete search history.

(56) References Cited

U.S. PATENT DOCUMENTS

| | | | |
|---|---|---|---|
| 3,430,486 A | 3/1969 | Richards | |
| 4,137,931 A | 2/1979 | Hasenbeck | |
| 6,289,725 B1 | 9/2001 | Hubbell et al. | |
| 6,782,909 B1 | 8/2004 | Ragless | |
| 6,976,386 B1 | 12/2005 | Grover et al. | |
| 7,256,589 B2* | 8/2007 | Andrade | G01L 1/146 324/662 |
| 7,944,220 B2 | 5/2011 | Lock | |
| 8,058,885 B2 | 11/2011 | Caron | |
| 8,627,709 B2 | 1/2014 | Caron et al. | |
| 2011/0057672 A1 | 3/2011 | Skaling | |
| 2016/0118970 A1* | 4/2016 | Kim | H03F 3/45968 330/254 |
| 2018/0335494 A1* | 11/2018 | Hakimuddin | G01N 24/081 |

FOREIGN PATENT DOCUMENTS

WO 1998004915 A1 2/1998

* cited by examiner

*Primary Examiner* — Alvaro E Fortich
*Assistant Examiner* — Zannatul Ferdous
(74) *Attorney, Agent, or Firm* — Lyon & Harr, LLP; Richard T. Lyon

(57) ABSTRACT

A capacitive matrix suction sensor measures the matrix suction exhibited by a porous medium surrounding the sensor. The sensor is constructed from a capacitive moisture probe having a sensing body, and a jacket that encases the sensing body. The jacket is made of a hydrophilic, non-conductive, porous (HN-CP) material. In operation, the sensing body is energized, and the voltage produced is read. The matrix suction exhibited by the HN-CP jacket material is then computed based on the voltage, and an indicator of the current value of the matrix suction exhibited by the porous medium is established based on the matrix suction computed for the HN-CP jacket material.

17 Claims, 6 Drawing Sheets

CAPACITIVE MATRIX SUCTION SENSOR HAVING A HYDROPHILIC, NON-CONDUCTIVE, POROUS JACKET

BACKGROUND

In the arts of soil science and hydrology, the hydraulic properties of various porous media are measured. In general, a probe or sensor is disposed in the media and used to take the measurements. The measurements are then employed to determine the current properties of the media and optionally to monitor the media on an ongoing basis to detect changes in its properties. The media can be tested in situ (e.g., one or more sensors can be disposed at different locations in a yard, farm field, process facility, or the like) or a sample of the media can be taken (such as a core sample and the like) and subsequently tested in a different setting such as a laboratory environment or the like.

The term "porous medium" refers to a medium which is composed of solids such as minerals and organic compositions, air and/or other gases, and one or more liquids, among other things. Exemplary types of porous media include soil (which may include materials such as clay, sediments and organic matter), wood, rock, concrete, slurries of various sorts, foodstuffs, and grains, among other things.

The aforementioned measurements are subsequently analyzed in various ways for various purposes such as studying the efficiency of irrigation and drainage, optimizing the availability of water for plants, optimizing the yield of crops, and minimizing erosion. These measurements can also be used to follow the movement of liquids in porous media, model soil pore structure, and predict plant growth and other associated factors.

SUMMARY

This Summary is provided to introduce a selection of concepts, in a simplified form, that are further described hereafter in the Detailed Description. This Summary is not intended to identify key features or essential features of the claimed subject matter, nor is it intended to be used as an aid in determining the scope of the claimed subject matter.

Capacitive matrix suction sensor implementations described herein generally involve a capacitive matrix suction sensor for measuring the matrix suction of a porous medium surrounding the sensor. In one exemplary implementation the capacitive matrix suction sensor includes a capacitive moisture probe that includes a sensing body and a jacket that encases the sensing body. The jacket is made of a hydrophilic, non-conductive, porous (HN-CP) material, which in one version has a voltage-to-liquid content profile which defines the relationship between a voltage caused by the capacitance of the HN-CP material of the jacket when the sensing body is energized and the amount of liquid held within the HN-CP material, and a known liquid-release curve which defines the relationship between the liquid content of the HN-CP material and the matrix suction of the material.

In one exemplary implementation the capacitive matrix suction sensor further includes an electronics module disposed within the base that energizes the sensing body, reads the voltage produced by the capacitance of the HN-CP material of the jacket when the sensing body is energized, computes the matrix suction exhibited by the HN-CP material of the jacket based on the read voltage, the voltage-to-liquid content profile and the known liquid-release curve, and establishes an indicator of the current value of the matrix suction exhibited by the porous medium surrounding the sensor based on the matrix suction computed for the HN-CP material of the jacket.

Another exemplary implementation involves a system for measuring the matrix suction of a porous medium. This system includes a capacitive matrix suction sensor which is inserted into the porous medium and which includes a capacitive moisture probe having a sensing body and a base, as well as a jacket that encases the sensing body. This jacket is made of a hydrophilic, non-conductive, porous (HN-CP) material. In addition, the system includes a matrix suction computing device and a matrix suction computer program having a plurality of sub-programs executable by the matrix suction computing device. These sub-programs configure the matrix suction computing device to perform the following actions. First, a current is initiated to energize the sensing body of the capacitive matrix suction sensor. The voltage caused by the capacitance of the HN-CP material of the jacket when the sensing body is energized is then read. The matrix suction exhibited by the HN-CP material of the jacket is computed based on the read voltage, a voltage-to-liquid content profile which defines the relationship between the voltage caused by the capacitance of the HN-CP material of the jacket when the sensing body is energized and the amount of liquid held within the HN-CP material and the known liquid-release curve which defines the relationship between the liquid content of the HN-CP material and the matrix suction of the material. An indicator of the current value of the matrix suction exhibited by the porous medium in which the capacitive matrix suction sensor is inserted is then established based on the matrix suction computed for the HN-CP material of the jacket.

DESCRIPTION OF THE DRAWINGS

The specific features, aspects, and advantages of the capacitive matrix suction sensor implementations described herein will become better understood with regard to the following description, appended claims, and accompanying drawings where:

DETAILED DESCRIPTION

Figure 1:
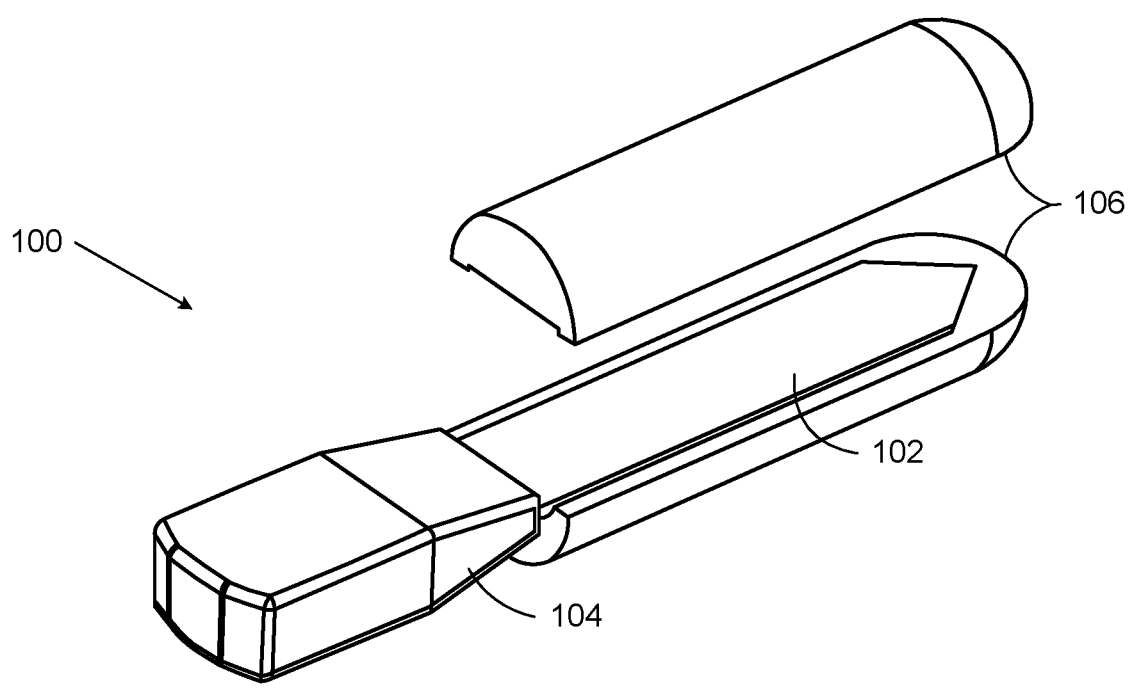
FIG. 1 is a diagram illustrating an exemplary implementation, in simplified form, of a capacitive matrix suction sensor for measuring the matrix suction of a porous medium surrounding the sensor, where the sensor has a cross-sectional cylindrical shaped HN-CP jacket with a dome-shaped distal end (shown in an exploded two-piece configuration).

In the following description reference is made to the accompanying drawings which form a part hereof, and in which are shown, by way of illustration, specific implementations in which a capacitive matrix suction sensor can be practiced. It is understood that other implementations can be utilized and structural changes can be made without departing from the scope of the capacitive matrix suction sensor.

It is also noted that for the sake of clarity specific terminology will be resorted to in describing the capacitive matrix suction sensor implementations described herein and it is not intended for these implementations to be limited to the specific terms so chosen. Furthermore, it is to be understood that each specific term includes all its technical equivalents that operate in a broadly similar manner to achieve a similar purpose. Reference herein to "one implementation", or "another implementation", or an "exemplary implementation", or an "alternate implementation", or "some implementations", or "one tested implementation"; or "one version", or "another version", or an "exemplary version", or an "alternate version", or "some versions", or "one tested version"; or "one variant", or "another variant", or an "exemplary variant", or an "alternate variant", or "some variants", or "one tested variant"; means that a particular feature, a particular structure, or particular characteristics described in connection with the implementation/version/variant can be included in one or more implementations of the capacitive matrix suction sensor. The appearances of the phrases "in one implementation", "in another implementation", "in an exemplary implementation", "in an alternate implementation", "in some implementations", "in one tested implementation"; "in one version", "in another version", "in an exemplary version", "in an alternate version", "in some versions", "in one tested version"; "in one variant", "in another variant", "in an exemplary variant", "in an alternate variant", "in some variants" and "in one tested variant"; in various places in the specification are not necessarily all referring to the same implementation/version/variant, nor are separate or alternative implementations/versions/variants mutually exclusive of other implementations/versions/variants. Yet furthermore, the order of process flow representing one or more implementations, or versions, or variants does not inherently indicate any particular order nor imply any limitations of the capacitive matrix suction sensor.

As utilized herein, the terms "module", "component," "system," "client" and the like can refer to a computer-related entity, either hardware, software (e.g., in execution), firmware, or a combination thereof. For example, a component can be a process running on a processor, an object, an executable, a program, a function, a library, a subroutine, a computer, or a combination of software and hardware. By way of illustration, both an application running on a server and the server can be a component. One or more components can reside within a process and a component can be localized on one computer and/or distributed between two or more computers. The term "processor" is generally understood to refer to a hardware component, such as a processing unit of a computer system.

Furthermore, to the extent that the terms "includes," "including," "has," "contains," and variants thereof, and other similar words are used in either this detailed description or the claims, these terms are intended to be inclusive, in a manner similar to the term "comprising", as an open transition word without precluding any additional or other elements.

1.0 Capacitive Matrix Suction Sensor with a Hydrophilic, Non-Conductive, Porous (HN-CP) Jacket In general, the capacitive matrix suction sensor implementations described herein are employed to measure the matrix suction exhibited by a porous medium. Matrix suction is a measurement of the adhesive pressures exerted by water or other liquid within the pore structure of a porous media that by nature tends to be in equilibrium with its surrounding media to equalize the overall moisture content. This is useful, for example, in estimating how much energy a plant would need to expend to draw moisture from the soil surrounding its roots, and therefore how much water should be added to the soil to minimize the energy the plant needs to expend.

More particularly, plants extract water from the soil surrounding their roots. As water is extracted from the voids in the porous soil adjacent the plant's roots, the remaining water molecules in the voids are held to the soil particle surfaces more tightly. The more tightly held water molecules exert a higher resistive force against the plant roots' suction force that draws in the water from the soil. The more water that is extracted, the larger the suction force must become as the water molecules cling more and more closely to the soil particle surfaces. Thus, it becomes harder and harder for the plant to extract more water. This phenomenon is akin to a straw where the diameter constantly becomes smaller and the suction required to draw in liquid increases vastly. The suction force is often referred to as the matrix potential or matrix suction. It has been estimated in the past that the ideal matrix suction range for optimum plant health is between about −10 to −50 centibars. In this range, the energy that the plant must expend to draw water from various differing surrounding soils can be measured and optimized for plant vitality.

Different soil types will produce a similar matrix suction value at very different volumetric soil moisture values. For example, at one extreme, soil primarily made up of fine sand can exhibit a matrix suction in the ideal range when its volumetric moisture content is well below 10 percent. Whereas, at the other extreme, soil primarily made up of clay may need a volumetric moisture content of up to 40 percent to exhibit a matrix suction in the ideal range. In view of this, a sensor that measures the matrix suction of soil (as does the capacitive matrix suction sensor implementations described herein), has an advantage over volumetric sensors that just measure the soil moisture as a percentage of soil volume. Namely, a matrix suction sensor can be used in an unknown type of soil and still provide an indication of the pore water environmental soil conditions with regard to maximizing plant health and minimizing stress conditions within the soil-water matrix.

It is noted that while the use of the capacitive matrix suction sensor implementations described herein is advantageous in measuring the matrix suction exhibited by soil, it is not intended that the sensor implementations be limited to measuring soil. Rather, any porous medium (e.g., wood, rock, concrete, slurries of various sorts, foodstuffs, and grains, among other things) that exhibits a matrix suction effect when a liquid is introduced can be measured using the capacitive matrix suction sensor implementations described herein.

FIG. 1 illustrates one exemplary implementation, in simplified form, of the aforementioned capacitive matrix suction sensor 100 for measuring the matrix suction of a porous medium surrounding the sensor. In general, this capacitive matrix suction sensor 100 is constructed from a capacitive moisture probe having a sensing body 102 and a base 104, as well as a jacket 106 that encases the sensing body. This jacket 106 is made of a hydrophilic, non-conductive, porous material (which will be abbreviated as a HN-CP material for the purposes of this description).

The HN-CP material is hydrophilic. Thus, it has an advantage in that a polar liquid (such as water) from the surrounding porous media being measured is "wicked" into the pores of the HN-CP material by capillary action. In other words and generally speaking, the liquid is naturally pulled from the media being measured and flows into the pores of the HN-CP material (or is pulled from the pores of the HN-CP material and flows back into the media being measured as the case may be) until the aforementioned equalization is achieved.

The HN-CP jacket can also be mass produced with very consistent and uniform pore structures throughout, thus making the aforementioned matrix suction measurements possible (as will be described in the sections to follow). Further, the HN-CP jacket is very durable and generally inert. Thus, the HN-CP jacket will not degrade or change its porosity properties when salt or other minerals or chemicals are present in the media being tested.

In the implementation illustrated in FIG. 1, the sensing body 102 of the sensor has an elongated, thin, flat, rectangular cuboid shape that extends from a base 104. The base 104 serves as a finger-hold for the sensor 100, as well as a waterproof protective housing for an electronics module and wiring (not shown) associated with the sensor. The sensing body has first and second electrodes formed on a substrate which is covered with a low dielectric constant material to provide a physical barrier to prevent a direct conduction path from the first electrode to the second electrode and to provide a waterproof protective barrier. Exemplary materials which can be used for the dielectric coating include, but are not limited to, plastic, epoxy, enamel, and the like. In one version, the capacitive moisture probe takes the form of a conventional, commercially available probe such as that sold by Pino-Tech under the name SoilWatch 10, although it is not intended that the capacitive matrix suction sensor implementations described herein be limited to the use of the SoilWatch 10 device. Rather, in general, any capacitive probe that when energized produces an output indicative of the moisture content of a surrounding porous medium (e.g., a voltage output or capacitance reading or moisture percentage) can be used instead.

As indicated previously, the jacket 106 that surrounds the elongated sensing body 102 (which is shown in an exploded two-piece configuration in FIG. 1) is made of a HN-CP material. For example, the HN-CP material can be a porous ceramic (e.g., a high flow alumina-based ceramic), porous plastic, or the like. This HN-CP material has a continuous, interconnected system of pores which is permeable to liquids, gasses and various combinations thereof. The pores in the HN-CP material have a known distribution throughout, and a known size distribution. The pore structure of a given HN-CP material can be specified in terms of an air entry value (which is commonly measured using a unit of "bubbling pressure" known as a "bar"). In one implementation, the HN-CP jacket is made of a porous material having a ½ bar pore structure. The ½ bar structure has the advantage of not losing liquid at a potentially unacceptable rate when the porous media being measured dries and pulls the liquid from the HN-CP jacket. However, it is not intended to limit the HN-CP jacket to a ceramic or plastic material, or to the just-stated pore structure. Other materials and pore structures may be employed as needed to accurately determine the matrix suction of the media being measured.

Referring again to implementation shown in FIG. 1, the jacket 106 that surrounds the elongated sensing body 102 has a cross-sectional cylindrical shape with a dome-shaped distal end. It is shown in a two-part configuration in FIG. 1, but that need not be the case. Rather, it can be formed as a single piece that slides over the sensing body 102, or in three or more pieces as desired. In implementations where the jacket is made of more than one piece, it is bonded together to form a single unit that surrounds the sensing body. It is noted that in tested implementations, bonding lines in the jacket had a negligible effect on the sensor readings.

Regardless of how the jacket is formed, the resulting structure has an interior cavity that conforms to the shape of the sensing body such that the walls of the jacket cavity contact the sensing body across its exterior surface without forming any significant gaps where liquid could pool (thereby adversely affecting the capacitance readings).

Figure 2:
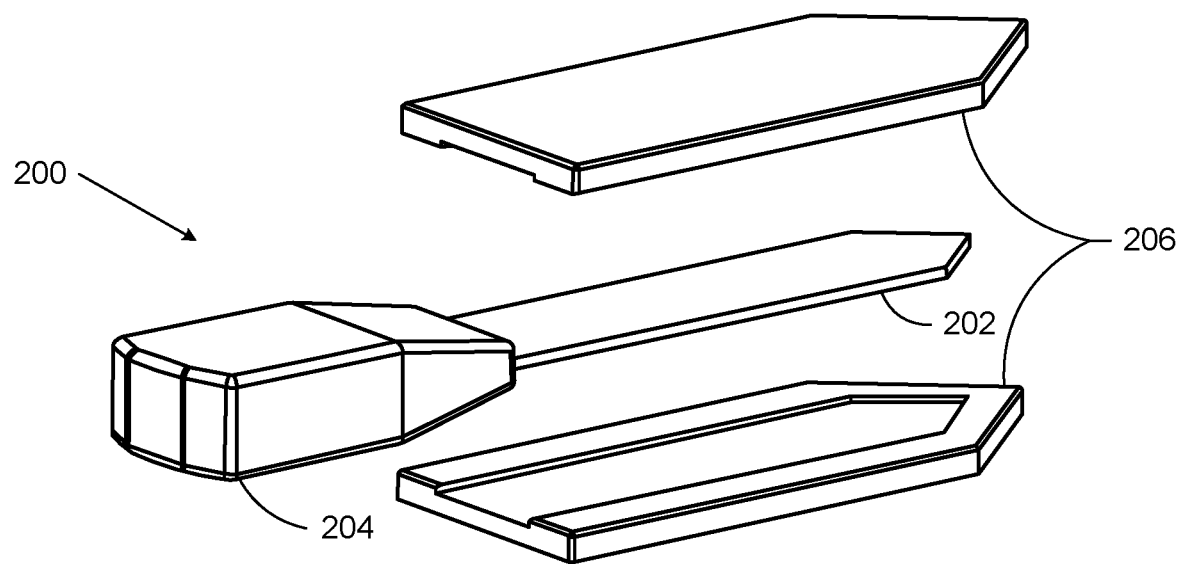
FIG. 2 is a diagram illustrating an exemplary implementation, in simplified form, of a capacitive matrix suction sensor for measuring the matrix suction of a porous medium surrounding the sensor, where the sensor has a cross-sectional rectangular cuboid shaped HN-CP jacket with a pointed triangular distal end (shown in an exploded two-piece configuration).

The capacitive matrix suction sensor implementations described herein are not limited to the cylindrical jacket shown in FIG. 1. Rather, it is believed any practical shape is possible without significantly affecting the capacitance readings. For example, FIG. 2 depicts an implementation of the capacitive matrix suction sensor 200 having a jacket 206 with a rectangular cuboid shape and a pointed triangular distal end (shown in an exploded two-piece configuration). Other jacket shapes are also possible, including, but not limited to jackets having a cross-sectional cylindrical shape with a conical-shaped distal end, or jackets having a cross-sectional shape forming a circle, or a rectangle, or a square, or a triangular, or an oval, or a pentagon, or a hexagon, or an octagon, or a star, among others. In any of these alternative cross-sectional shapes, the exterior of the jacket can have a pointed distal end to facilitate its insertion into the porous medium being measured.

In any of the foregoing implementations of the capacitive matrix suction sensor jacket, the thickness of the jacket as measured from the wall of the interior cavity to the exterior surface is at least a minimum thickness that ensures the jacket is structurally sound enough to be inserted into the porous medium being measured without breaking.

It is further noted that the HN-CP material of capacitive matrix suction sensor jacket has a voltage-to-liquid (moisture) content profile which defines the relationship between a voltage caused by the capacitance of the HN-CP material of the jacket when the sensing body is energized and the amount of liquid held within the HN-CP material. The HN-CP material also exhibits a known liquid-release curve which defines the relationship between the liquid content of the HN-CP material and the matrix suction (also sometimes called the matrix potential) of the material.

1.1 Electronics Module

As described previously, the base (e.g., 104 in FIGS. 1 and 204 in FIG. 2) can serve as a waterproof protective housing for an electronics module and wiring associated with implementations of the capacitive matrix suction sensor. The electronics module and wiring can take several forms.

Figure 3:
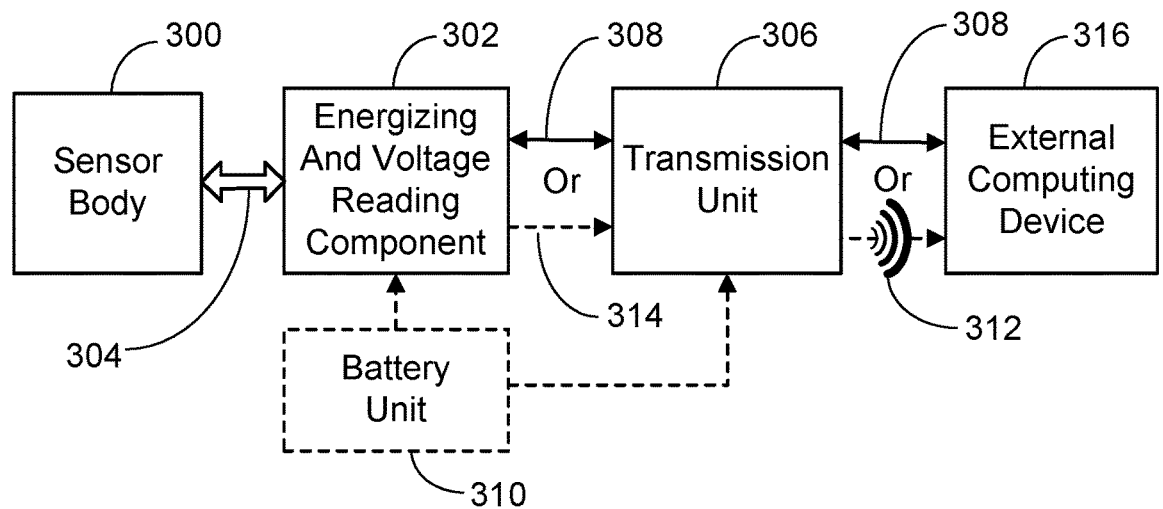
FIG. 3 is a diagram illustrating one implementation, in simplified form, of the components making up a simple version of the capacitive matrix suction sensor's electronics module.

In one simpler implementation, the electronics module energizes the sensing body and outputs the voltage produced by the capacitance of the HN-CP material of the jacket when the sensing body is energized. FIG. 3 illustrates one exemplary implementation, in simplified form, of the aforementioned simpler electronics module. In this implementation, the sensing body 300 is connected to an energizing and voltage reading component 302 via connection path 304. The energizing and voltage reading component 302 is connected to a transmission unit 306. In one version (such as the one employed in the aforementioned exemplary SoilWatch 10 device), the transmission unit 306 takes the form of a three-wire cable 308 that provides power to energize the sensing body 300 and outputs the resulting capacitance induced voltage. It is noted that in this wired version, the previously described base of the capacitive moisture probe can be reduced in size or even eliminated. In an alternate version, the power to energize the sensing body 300 is provided a separate on-board battery unit 310 that supplies power to the energizing and voltage reading component 302 in lieu of the aforementioned three-wire cable 308. Note that the optional nature of the on-board battery unit 310 is shown in FIG. 3 by the use of a broken line box. In another implementation, the transmission unit 306 takes the form of a wireless transmission device that wirelessly transmits a signal 312 indicative of the voltage reading output 314. Here again, in this implementation, an on-board battery unit 310 is used to power the sensing body 300, as well as the wireless transmission unit 306. In any of the foregoing implementations, the signal indicative of the voltage reading output is transmitted (either via a wired or wireless connection) to an external computing device 316 (such as one described in the Exemplary Operating Environments section). The aforementioned commercially available probe sold by Pino-Tech under the name SoilWatch 10 is an example of a device having an electronics module with a simple wired output of the voltage signal. In general, the transmitted voltage signal is employed by the external computing device 316 to compute a current value of the matrix suction exhibited by the porous medium surrounding the capacitive matrix suction sensor (as will be described in more detail in the paragraphs to follow).

Figure 4:
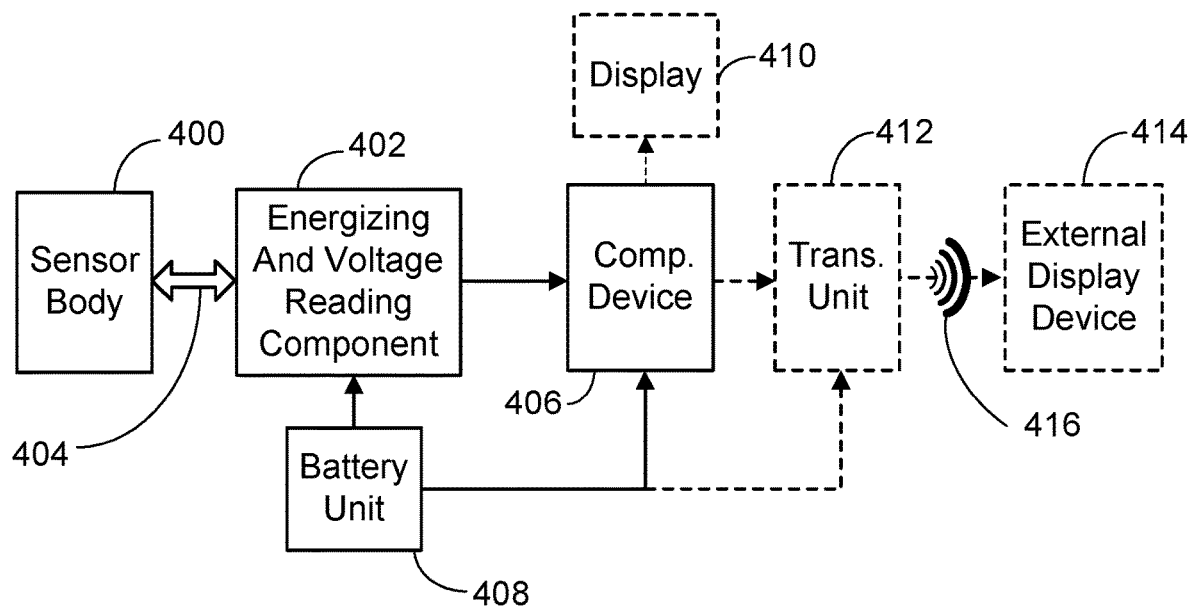
FIG. 4 is a diagram illustrating one implementation, in simplified form, of the components making up a more complex version of the capacitive matrix suction sensor's electronics module.

In a more complex implementation, the electronics module not only energizes the sensing body and reads the voltage produced by the capacitance of the HN-CP material of the jacket when the sensing body is energized, but also computes a current value of the matrix suction exhibited by the porous medium surrounding the capacitive matrix suction sensor. FIG. 4 illustrates one exemplary implementation, in simplified form, of the aforementioned more complex electronics module. In this implementation, the sensing body 400 is connected to an energizing and voltage reading component 402 via connection path 404. The energizing and voltage reading component 402 is connected to a computing device 406 (such as described in the Exemplary Operating Environments section). The computing device 406 is employed to compute a current value of the matrix suction exhibited by the porous medium surrounding the capacitive matrix suction sensor (as will be described in more detail in the paragraphs to follow). An on-board battery unit 408 is included to supply power to the energizing and voltage reading component 402 to energize the sensing body 400, and to the computing device 406. In one version, the electronics module also includes a display device 410, which is connected to the computing device 406 and disposed within the base of the capacitive matrix suction sensor and visible from its exterior. The optional nature of the display device 410 is shown in FIG. 4 by the use of a broken line box. The on-board display device 410 is employed to display an indicator of the current value of the matrix suction exhibited by the porous medium surrounding the sensor. In another version, an external display device 414 is used to display the current value of the matrix suction to a user. In this version, the electronics module includes a transmission unit 412. The optional nature of the transmission unit 412 and the external display device 414 are indicated in FIG. 4 by the use of broken line boxes. The transmission unit 412 can be powered via the on-board battery unit 406 and is employed to transmit a signal 416 indicative of the matrix suction exhibited by the surrounding porous medium to the external display device 414. This transmission can be via a wired connection, although typically it would be sent via a wireless connection as shown in FIG. 4.

It is noted that in other implementations of the capacitive matrix suction sensor, the foregoing electronics module configurations can be employed, but modified to perform more or less of the functions described above. For example, the previously-described internal computing device (406 in FIG. 4) may only compute the capacitance exhibited by the jacket, and a signal indicative of the capacitance value would be transmitted (via wired or wireless connection) to an external computing device that would compute the matrix suction and display it to the user. In this case, the external computing device would compute the liquid content of the jacket from the capacitance value. Or, in yet another implementation, the internal computing device (406 in FIG. 4) may compute the liquid content of the jacket, and a signal indicative of the liquid content would be transmitted (via wired or wireless connection) to an external computing device that would compute the matrix suction and display it to the user.

It is also noted that in any of the foregoing implementations of the electronics module, an activation switch (not shown in the figures) can be included that turns on and off the current (either from the on-board battery unit or a wired external source) to the sensing body. This current is used to energize the sensing body. In one version, the activation switch is a physical switch built into the base and accessible to a user from the base's exterior. In another version, the activation switch is internal to the base and is activated either via the aforementioned wired connection or via the aforementioned wireless connection.

1.1.1 System Framework for Measuring Matrix Suction

Figure 5:
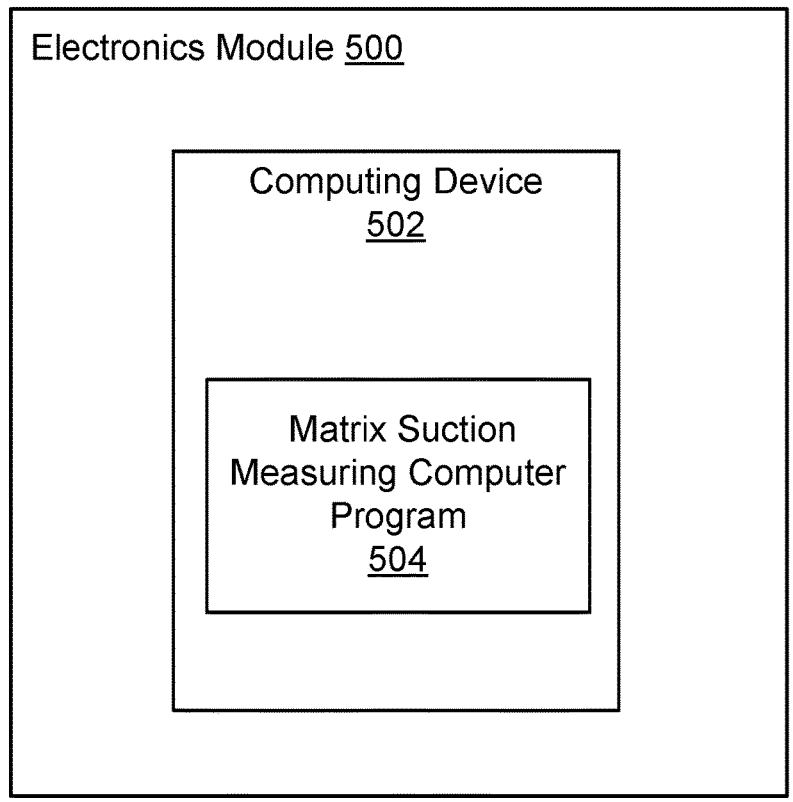
FIG. 5 is a diagram illustrating one implementation, in simplified form, of a system framework for measuring the matrix suction of a porous medium surrounding the capacitive matrix suction sensor.

FIG. 5 illustrates one implementation, in simplified form, of a system framework for measuring the matrix suction of a porous medium surrounding the capacitive matrix suction sensor. As exemplified in FIG. 5, the system framework includes an electronics module 500. This electronics module 500 is disposed within the base of the capacitive matrix suction sensor, and includes a computing device 502 running a matrix suction measuring computer program 504 having a plurality of sub-programs executable by the computing device of the electronics module.

Figure 6:
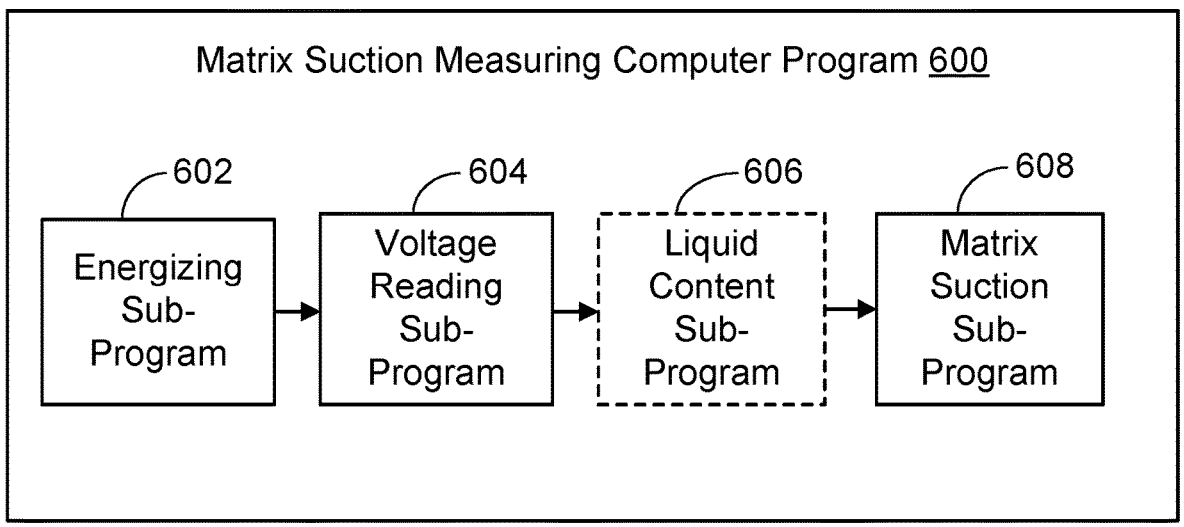
FIG. 6 is a diagram illustrating one implementation, in simplified form, of sub-programs included in the matrix suction measuring computer program.

FIG. 6 illustrates one implementation, in simplified form, of sub-programs included in the matrix suction measuring computer program 600 that configure the aforementioned computing device. More particularly, an energizing sub-program 602 is included as shown in FIG. 6. The energizing sub-program 602 energizes the sensing body of the capacitive matrix suction sensor. The matrix suction measuring computer program 600 also includes a voltage reading sub-program 604. The voltage reading sub-program 604 reads the voltage produced by the capacitance of the HN-CP material of the jacket when the sensing body is energized. A matrix suction sub-program 608 computes the matrix suction exhibited by the HN-CP material of the jacket based on the read voltage, and establishes an indicator of the current value of the matrix suction exhibited by the porous medium surrounding the sensor based on the matrix suction computed for the HN-CP material of the jacket. It is noted that in an alternative implementation, an intermediary sub-program is executed once the voltage has been read, but before the matrix suction is computed. More particularly, a liquid content (also sometimes called the moisture content) sub-program 606 computes the liquid content of the HN-CP material of the jacket based on the read voltage. In this alternative implementation, the computed liquid content is then used by the matrix suction sub-program 608 to compute the matrix suction exhibited by the HN-CP material of the jacket. The optional nature of the liquid content sub-program 606 is shown in FIG. 6 by the use of a broken line box.

1.1.2 Process for Measuring Matrix Suction

Figure 7:
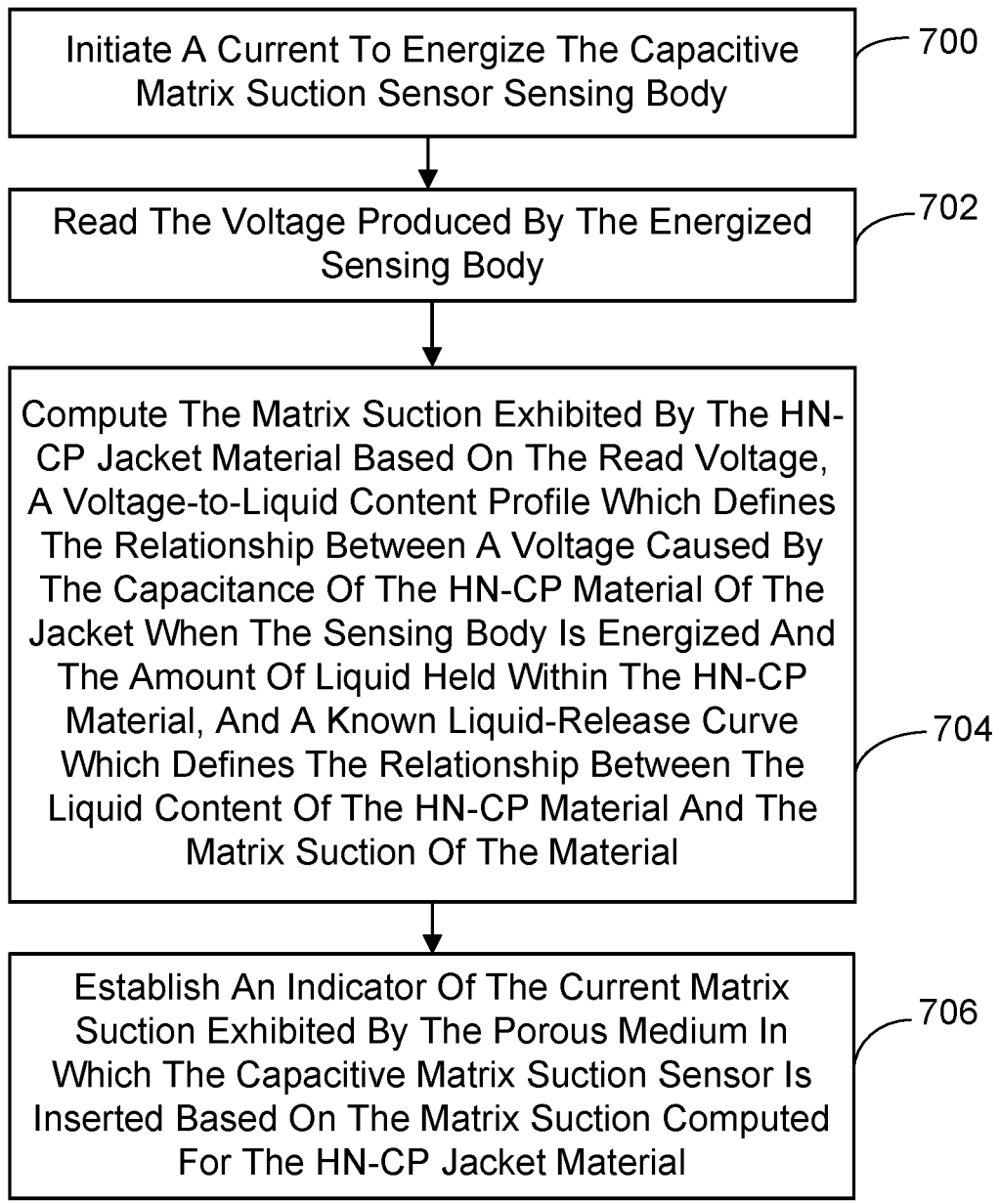
FIG. 7 is a flow diagram illustrating an exemplary implementation, in simplified form, of a process for measuring the matrix suction of a porous medium surrounding the capacitive matrix suction sensor.

FIG. 7 illustrates an exemplary implementation, in simplified form, of a process for measuring the matrix suction of a porous medium surrounding the capacitive matrix suction sensor based on the above-described matrix suction measuring computer program as realized on the system framework 500 illustrated in FIG. 5. As exemplified in FIG. 7, the process starts with initiating a current to energize the capacitive matrix suction sensor sensing body (process action 700) and then reading the voltage produced by the energized sensing body (process action 702). The matrix suction exhibited by the HN-CP material of the jacket is computed based on the read voltage, a voltage-to-liquid content profile which defines the relationship between a voltage caused by the capacitance of the HN-CP material of the jacket when the sensing body is energized and the amount of liquid held within the HN-CP material and a known liquid-release curve which defines the relationship between the liquid content of the HN-CP material and the matrix suction of the material (process action 704). An indicator of the current value of the matrix suction exhibited by the porous medium in which the capacitive matrix suction sensor is inserted is then established based on the matrix suction computed for the HN-CP material of the jacket (process action 706).

It is noted that in an alternative implementation, the process action of computing the matrix suction involves a two-step procedure where the liquid content of the HN-CP material of the jacket is computed first based on the read voltage and the voltage-to-liquid content profile, and then the matrix suction exhibited by the HN-CP material of the jacket is computed based on the computed liquid content and the known liquid-release curve. This alternative implementation is useful in cases where the liquid content of the HN-CP material of the jacket is computed using an on-board computing device, whereas the matrix suction exhibited by the HN-CP material of the jacket and the indicator of the current value of the matrix suction exhibited by the porous medium in which the capacitive matrix suction sensor is inserted are established by an external computing device.

1.2 Capacitive Matrix Suction Sensor Operation

One exemplary environment for operating the capacitive matrix suction sensor implementations described herein generally includes the following. A capacitive matrix suction sensor is disposed within a porous medium which is being measured. More particularly, the capacitive matrix suction sensor is disposed in the media such that the outer surface of the sensor's jacket comes into contact with and is surrounded by the porous media. For example, the capacitive matrix suction sensor can be used to measure the matrix suction of soil. In this scenario, the part of the sensor below its previously-described base is inserted into the soil, either by driving it into the soil if the soil is loose enough not to damage the sensor, or interference-fitted into a pre-made hole in the soil.

In general, the HN-CP jacket of the sensor provides a means for absorbing a liquid from the porous media it is in contact with. In other words, since the outer surface of the HN-CP jacket is exposed to the porous media being measured, the jacket maintains fluid contact with the media. This allows for fast equalization of the liquid content within the media being measured and the liquid content within the HN-CP jacket, and also allows this equalization to be continuously maintained as the liquid content within the surrounding media changes. When the capacitive matrix suction sensor is first introduced into a porous material, its HN-CP jacket pulls in liquid (e.g., water) from the surrounding porous material (e.g., soil) into the jacket material until an equilibrium between the jacket matrix suction and the surrounding material's matrix suction is reached. Then, if the liquid content of the media increases, additional liquid can flow from the media and be absorbed into the HN-CP jacket until the liquid content within the media and the jacket material is re-equalized. Likewise, if the liquid content of the media decreases, liquid can flow from the HN-CP jacket and be absorbed back into the media until the liquid content within the media and the jacket material is re-equalized.

As this equalization and re-equalization occurs, the capacitive matrix suction sensor measures the voltage/capacitance of the jacket and computes its current matrix suction. In general, the electrical capacitance of the HN-CP jacket depends on the amount of fluid in the jacket, and the amount of fluid in the jacket depends on its matrix suction. Given this, it will be appreciated that the effective capacitance of the HN-CP jacket changes in conjunction with changes in the amount of liquid in the jacket material. In other words, the ratio of liquid to air within the pores of the HN-CP jacket generally determines the effective capacitance of the jacket material. Thus, it will be further appreciated that the HN-CP jacket operates as a discrete variable capacitor having an effective capacitance that can be measured by the capacitive matrix suction sensor.

In view of the foregoing, in operation, the capacitive matrix suction sensor is activated and its sensing body is energized. The capacitive matrix suction sensor reads a voltage which corresponds to the capacitance of the surrounding jacket. The capacitance of the surrounding jacket is dependent on the moisture content in the porous jacket material. Thus, using the aforementioned voltage-to-liquid (moisture) content profile (that defines the relationship between the voltage exhibited by the HN-CP material of the jacket and the amount of liquid held within the HN-CP material), the moisture content is determined. Since the jacket is made from a porous material with known characteristics (porosity, pore distribution, etc.), a water-retention curve can be created using the any of several well-known models (such as the van Genuchten model). This water retention curve plots the moisture content in the porous jacket against the matrix suction. Thus, the matrix suction can be computed directly using the water-retention model of choice based on the measured moisture content, or a lookup table can be constructed which provides the jacket's matrix suction for each of a series of step-wise moisture content values. Regardless of how it is obtained, this matrix suction value reflects the current matrix suction exhibited by the surrounding material.

In the example of a plant in soil, the matrix suction exhibited by the soil is indicative of how much energy has to be expended by the plant to pull water in from the soil. The goal is to minimize the amount of energy required. Thus, for example, a gardener could add water to the soil, wait for the probe readout to stabilize (thereby indicating that equilibrium with the surrounding soil has been achieved). The gardener then notes whether the current matrix suction reading is lower than the previous reading. If so, the procedure can be repeated until the reading does not significantly change. This corresponds to roughly the minimum energy point for a plant. In other words, the soil's moisture content is at a level that a plant rooted in the soil expends the minimum amount of energy possible to draw water from the soil. Of course, the foregoing procedure can be automated using a program running on the probe's processor that monitors the matrix suction values as the gardener adds water to the soil and determines when the matrix suction stops decreasing. At that point the probe would alert the gardener that enough water has been added to the soil.

2.0 Other Advantages and Implementations

While the capacitive matrix suction sensor has been described by specific reference to implementations thereof, it is understood that variations and modifications thereof can be made without departing from the true spirit and scope. For instance, the electronics module of the capacitive matrix suction sensor can be further configured to establish an indicator of whether liquid should be added to the porous medium surrounding the sensor based on the current value of the matrix suction exhibited by the porous medium. This liquid addition indicator can be provided to the user via the previously described user-interfaces in addition to, or in lieu of, the previously described indicator of the current value of the matrix suction exhibited by the porous medium surrounding the sensor. As an example, it was previously indicated that the matrix suction associated with the range of matrix suction values representing the most energy efficient range for a plant is roughly −10 to −50 centibars. The electronic module of the capacitive matrix suction sensor can be configured to direct a gardener to add water depending on the current "equilibrium" matrix suction value sensed. It is noted that the equilibrium occurs when the jacket no longer pulls water in when the jacket is exerting more pull than the surrounding material, and when the surrounding material no longer pulls water out of the jacket when the surrounding soil is exerting more pull than the jacket. If the equilibrium matrix suction is greater than about −50 centibars, the electronic module issues the liquid addition indicator.

Further, while up to this point the description of the capacitive matrix suction sensor implementations described herein has been directed to its stand-alone use in measuring porous materials, this need not be the case. Rather, a multi-sensor environment is possible. For instance, a plurality of capacitive matrix suction sensors can be employed where each sensor is disposed at a different location within the porous medium so as to provide an analysis of the medium which covers a larger vertical and/or horizontal area. One example of such a scenario would be the use of the capacitive matrix suction sensor implementations having a wireless transmission unit that transmits the matrix suction value associated with the porous medium in an area surrounding the sensor to a remote computing device. This remote computing device is configured to gather multiple matrix suction measurements from various locations and present it to the user. In this way, the user would get a bigger picture of the conditions in porous medium across a larger area (vertically and/or horizontally) than would be possible using a single sensor.

It is further noted that any or all of the implementations that are described in the present document and any or all of the implementations that are illustrated in the accompanying drawings may be used and thus claimed in any combination desired to form additional hybrid implementations. In addition, although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What has been described above includes example implementations. It is, of course, not possible to describe every conceivable combination of components or methodologies for purposes of describing the claimed subject matter, but one of ordinary skill in the art may recognize that many further combinations and permutations are possible. Accordingly, the claimed subject matter is intended to embrace all such alterations, modifications, and variations that fall within the spirit and scope of the appended claims.

In regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the foregoing implementations include a system as well as a computer-readable storage media having computer-executable instructions for performing the acts and/or events of the various methods of the claimed subject matter.

There are multiple ways of realizing the foregoing implementations (such as an appropriate application programming interface (API), tool kit, driver code, operating system, control, standalone or downloadable software object, or the like), which enable applications and services to use the implementations described herein. The claimed subject matter contemplates this use from the standpoint of an API (or other software object), as well as from the standpoint of a software or hardware object that operates according to the implementations set forth herein. Thus, various implementations described herein may have aspects that are wholly in hardware, or partly in hardware and partly in software, or wholly in software.

The aforementioned systems have been described with respect to interaction between several components. It will be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (e.g., hierarchical components).

Additionally, it is noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but generally known by those of skill in the art.

3.0 Exemplary Operating Environments

Figure 8:
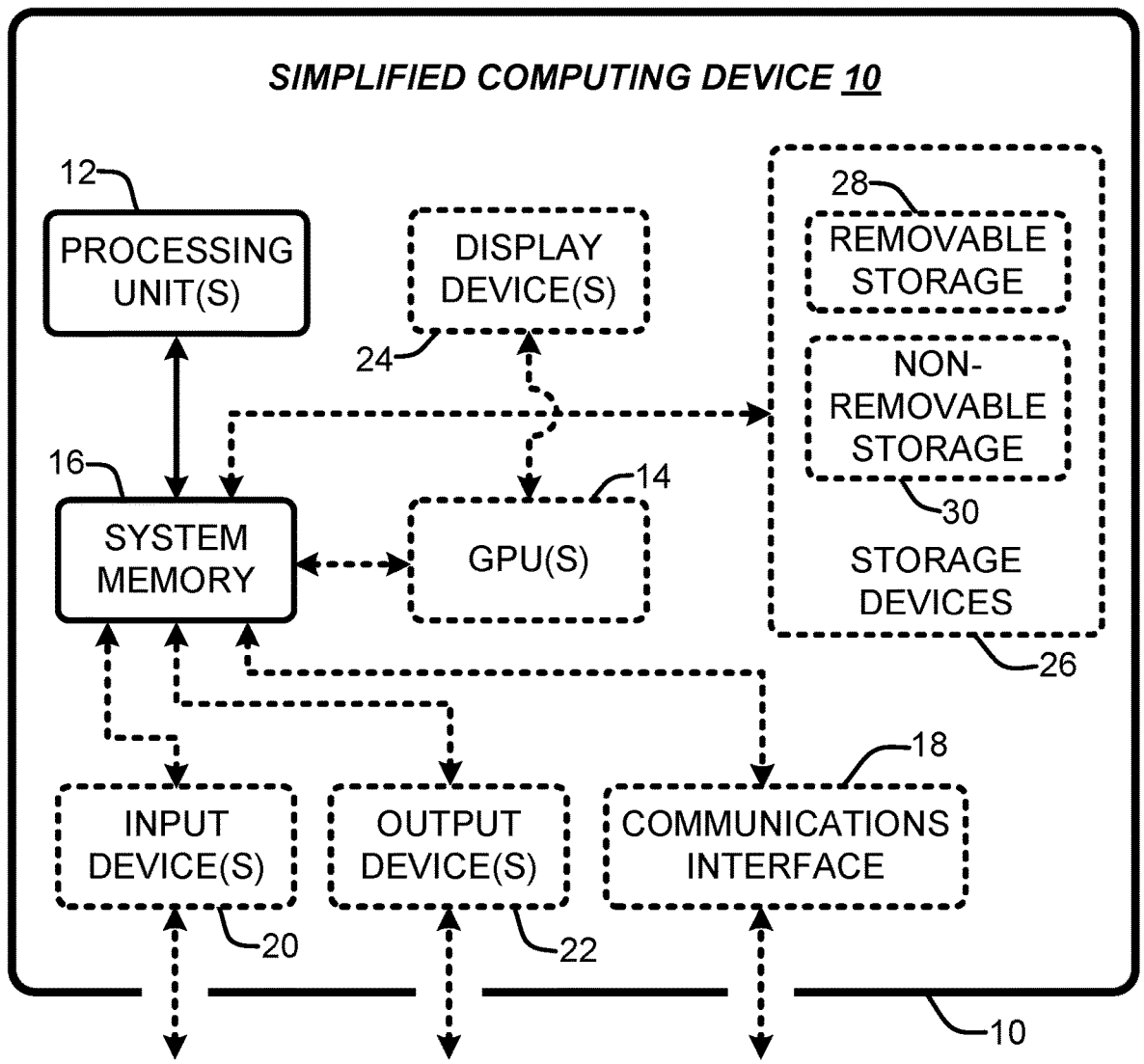
FIG. 8 is a diagram illustrating a simplified example of a general-purpose computer system on which various implementations and elements of the capacitive matrix suction sensor's electronics module, as described herein, may be realized

The capacitive matrix suction sensor implementations described herein are operational within numerous types of general purpose or special purpose computing system environments or configurations. FIG. 8 illustrates a simplified example of a general-purpose computer system on which various implementations and elements of the capacitive matrix suction sensor, as described herein, may be implemented. It is noted that any boxes that are represented by broken or dashed lines in the simplified computing device 10 shown in FIG. 8 represent alternate implementations of the simplified computing device. As described below, any or all of these alternate implementations may be used in combination with other alternate implementations that are described throughout this document. The simplified computing device 10 is typically found in devices having at least some minimum computational capability such as personal computers (PCs), server computers, handheld computing devices, laptop or mobile computers, communications devices such as cell phones and personal digital assistants (PDAs), multiprocessor systems, microprocessor-based systems, set top boxes, programmable consumer electronics, network PCs, minicomputers, mainframe computers, and audio or video media players.

To allow a device to realize the capacitive matrix suction sensor implementations described herein, the device should have a sufficient computational capability and system memory to enable basic computational operations. In particular, the computational capability of the simplified computing device 10 shown in FIG. 8 is generally illustrated by one or more processing unit(s) 12, and may also include one or more graphics processing units (GPUs) 14, either or both in communication with system memory 16. Note that that the processing unit(s) 12 of the simplified computing device 10 may be specialized microprocessors (such as a digital signal processor (DSP), a very long instruction word (VLIW) processor, a field-programmable gate array (FPGA), or other micro-controller) or can be conventional central processing units (CPUs) having one or more processing cores.

In addition, the simplified computing device 10 may also include other components, such as, for example, a communications interface 18. The simplified computing device 10 may also include one or more conventional computer input devices 20 (e.g., touchscreens, touch-sensitive surfaces, pointing devices, keyboards, audio input devices, voice or speech-based input and control devices, video input devices, haptic input devices, devices for receiving wired or wireless data transmissions, and the like) or any combination of such devices.

Similarly, various interactions with the simplified computing device 10 and with any other component or feature of the capacitive matrix suction sensor implementations described herein, including input, output, control, feedback, and response to one or more users or other devices or systems associated with the capacitive matrix suction sensor implementations, are enabled by a variety of Natural User Interface (NUI) scenarios. The NUI techniques and scenarios enabled by the capacitive matrix suction sensor implementations include, but are not limited to, interface technologies that allow one or more users user to interact with the capacitive matrix suction sensor implementations in a "natural" manner, free from artificial constraints imposed by input devices such as mice, keyboards, remote controls, and the like.

Such NUI implementations are enabled by the use of various techniques including, but not limited to, using NUI information derived from user speech or vocalizations captured via microphones or other sensors (e.g., speech and/or voice recognition). Such NUI implementations are also enabled by the use of various techniques including, but not limited to, information derived from a user's facial expressions and from the positions, motions, or orientations of a user's hands, fingers, wrists, arms, legs, body, head, eyes, and the like, where such information may be captured using various types of 2D or depth imaging devices such as stereoscopic or time-of-flight camera systems, infrared camera systems, RGB (red, green and blue) camera systems, and the like, or any combination of such devices. Further examples of such NUI implementations include, but are not limited to, NUI information derived from touch and stylus recognition, gesture recognition (both onscreen and adjacent to the screen or display surface), air or contact-based gestures, user touch (on various surfaces, objects or other users), hover-based inputs or actions, and the like. Such NUI implementations may also include, but are not limited, the use of various predictive machine intelligence processes that evaluate current or past user behaviors, inputs, actions, etc., either alone or in combination with other NUI information, to predict information such as user intentions, desires, and/or goals. Regardless of the type or source of the NUI-based information, such information may then be used to initiate, terminate, or otherwise control or interact with one or more inputs, outputs, actions, or functional features of the capacitive matrix suction sensor implementations described herein.

However, it should be understood that the aforementioned exemplary NUI scenarios may be further augmented by combining the use of artificial constraints or additional signals with any combination of NUI inputs. Such artificial constraints or additional signals may be imposed or generated by input devices such as mice, keyboards, and remote controls, or by a variety of remote or user worn devices such as accelerometers, electromyography (EMG) sensors for receiving myoelectric signals representative of electrical signals generated by user's muscles, heart-rate monitors, galvanic skin conduction sensors for measuring user perspiration, wearable or remote biosensors for measuring or otherwise sensing user brain activity or electric fields, wearable or remote biosensors for measuring user body temperature changes or differentials, and the like. Any such information derived from these types of artificial constraints or additional signals may be combined with any one or more NUI inputs to initiate, terminate, or otherwise control or interact with one or more inputs, outputs, actions, or functional features of the capacitive matrix suction sensor implementations described herein.

The simplified computing device 10 may also include other optional components such as one or more conventional computer output devices 22 (e.g., display device(s) 24, audio output devices, video output devices, devices for transmitting wired or wireless data transmissions, and the like). Note that typical communications interfaces 18, input devices 20, output devices 22, and storage devices 26 for general-purpose computers are well known to those skilled in the art, and will not be described in detail herein.

The simplified computing device 10 shown in FIG. 8 may also include a variety of computer-readable media. Computer-readable media can be any available media that can be accessed by the computer 10 via storage devices 26, and can include both volatile and nonvolatile media that is either removable 28 and/or non-removable 30, for storage of information such as computer-readable or computer-executable instructions, data structures, programs, sub-programs, or other data. Computer-readable media includes computer storage media and communication media. Computer storage media refers to tangible computer-readable or machine-readable media or storage devices such as digital versatile disks (DVDs), blu-ray discs (BD), compact discs (CDs), floppy disks, tape drives, hard drives, optical drives, solid state memory devices, random access memory (RAM), read-only memory (ROM), electrically erasable programmable read-only memory (EEPROM), CD-ROM or other optical disk storage, smart cards, flash memory (e.g., card, stick, and key drive), magnetic cassettes, magnetic tapes, magnetic disk storage, magnetic strips, or other magnetic storage devices. Further, a propagated signal is not included within the scope of computer-readable storage media.

Retention of information such as computer-readable or computer-executable instructions, data structures, programs, sub-programs, and the like, can also be accomplished by using any of a variety of the aforementioned communication media (as opposed to computer storage media) to encode one or more modulated data signals or carrier waves, or other transport mechanisms or communications protocols, and can include any wired or wireless information delivery mechanism. Note that the terms "modulated data signal" or "carrier wave" generally refer to a signal that has one or more of its characteristics set or changed in such a manner as to encode information in the signal. For example, communication media can include wired media such as a wired network or direct-wired connection carrying one or more modulated data signals, and wireless media such as acoustic, radio frequency (RF), infrared, laser, and other wireless media for transmitting and/or receiving one or more modulated data signals or carrier waves.

Furthermore, software, programs, sub-programs, and/or computer program products embodying some or all of the various capacitive matrix suction sensor implementations described herein, or portions thereof, may be stored, received, transmitted, or read from any desired combination of computer-readable or machine-readable media or storage devices and communication media in the form of computer-executable instructions or other data structures. Additionally, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, or media.

The capacitive matrix suction sensor implementations described herein may be further described in the general context of computer-executable instructions, such as programs, sub-programs, being executed by a computing device. Generally, sub-programs include routines, programs, objects, components, data structures, and the like, that perform particular tasks or implement particular abstract data types. The capacitive matrix suction sensor implementations may also be practiced in distributed computing environments where tasks are performed by one or more remote processing devices, or within a cloud of one or more devices, that are linked through one or more communications networks. In a distributed computing environment, sub-programs may be located in both local and remote computer storage media including media storage devices. Additionally, the aforementioned instructions may be implemented, in part or in whole, as hardware logic circuits, which may or may not include a processor. Still further, the capacitive matrix suction sensor implementations described herein can be virtualized and realized as a virtual machine running on a computing device such as any of those described previously. In addition, multiple virtual machines can operate independently on the same computer device.

Alternatively, or in addition, the functionality described herein can be performed, at least in part, by one or more hardware logic components. For example, and without limitation, illustrative types of hardware logic components that can be used include FPGAs, application-specific integrated circuits (ASICs), application-specific standard products (ASSPs), system-on-a-chip systems (SOCs), complex programmable logic devices (CPLDs), and so on.

Wherefore, what is claimed is:

1. A capacitive matrix suction sensor for measuring the matrix suction of a porous medium surrounding the sensor, comprising:
    a capacitive moisture probe comprising a sensing body; and a jacket that encases the sensing body, said jacket being comprised of a hydrophilic, non-conductive, porous (HN-CP) material,
    wherein the sensing body further comprises first and second electrodes formed on a substrate which is covered with a low dielectric constant material to provide a physical barrier to prevent a direct conduction path from the first electrode to the second electrode and to provide a waterproof protective barrier;
    a base from which the sensing body extends, wherein the base serves as a protective housing for an electronics module and wiring associated with the sensor, and wherein the electronics module energizes the sensing body and reads a voltage produced by a capacitance of the HN-CP material of the jacket when the sensing body is energized, and wherein the electronics module comprising a transmission device which transmits a signal indicative of said voltage, either via a wired connection or wireless connection, said transmitted signal capable of being employed to compute a current value of the matrix suction exhibited by the porous medium surrounding the sensor,
    wherein the HN-CP material employed in the jacket exhibits a continuous, interconnected system of pores which is permeable to liquids, gasses and combinations thereof, and wherein the pores have a known distribution throughout, and a known size distribution.

2. The capacitive matrix suction sensor of claim 1, wherein the sensing body comprises an elongated, thin, flat, rectangular cuboid body.

3. The capacitive matrix suction sensor of claim 1, wherein the interconnected system of pores of the HN-CP material employed in the jacket exhibit an air entry value of 14 bar.

4. The capacitive matrix suction sensor of claim 1, wherein the HN-CP material employed in the jacket is one of a porous ceramic material or a porous plastic material.

5. The capacitive matrix suction sensor of claim 1, wherein the jacket comprises an interior cavity that conforms to the shape of the sensing body such that the walls of the jacket cavity contact the sensing body across its exterior surface without forming any significant gaps where liquid could pool.

6. The capacitive matrix suction sensor of claim 1, wherein the exterior of the jacket has a cross-sectional cylindrical shape with a dome-shaped distal end.

7. The capacitive matrix suction sensor of claim 1, wherein the exterior of the jacket has a cross-sectional cylindrical shape with a conical-shaped distal end.

8. The capacitive matrix suction sensor of claim 1, wherein the exterior of the jacket has a cross-sectional rectangular cuboid shape with a pointed triangular distal end.

9. The capacitive matrix suction sensor of claim 1, wherein the exterior of the jacket has a cross-sectional shape forming a circle, or a rectangle, or a square, or a triangular, or an oval, or a pentagon, or a hexagon, or an octagon, or a star.

10. The capacitive matrix suction sensor of claim 9, wherein the distal end of the exterior of the jacket has a pointed shape.

11. The capacitive matrix suction sensor of claim 1, wherein the jacket comprises an interior cavity that conforms to the shape of the sensing body such that the walls of the jacket cavity contact the sensing body across its entire exterior surface without forming any significant gaps where liquid could pool.

12. A capacitive matrix suction sensor for measuring the matrix suction of a porous medium surrounding the sensor, comprising:
 a capacitive moisture probe comprising a sensing body and a base; a jacket that encases the sensing body, said jacket being comprises of a hydrophilic, non-conductive, porous (HN-CP) material having a voltage-to-liquid content profile which defines the relationship between a voltage caused by a capacitance of the HN-CP material of the jacket when the sensing body is energized and the amount of liquid held within the HN-CP material, and a known liquid-release curve which defines the relationship between the liquid content of the HN-CP material and the matrix suction of the material; and
 an electronics module disposed within the base which energizes the sensing body, reads the voltage produced by the capacitance of the HN-CP material of the jacket when the sensing body is energized, computes the matrix suction exhibited by the HN-CP material of the jacket based on the read voltage, the voltage-to-liquid content profile and the known liquid-release curve, and establishes an indicator of the current value of the matrix suction exhibited by the porous medium surrounding the sensor based on the matrix suction computed for the HN-CP material of the jacket.

13. The capacitive matrix suction sensor of claim 12, further comprising a display device disposed within the base and visible from the exterior thereof, and wherein the indicator of the current value of the matrix suction exhibited by the porous medium surrounding the sensor is displayed on the display device.

14. The capacitive matrix suction sensor of claim 13, wherein the electronics module further comprising a transmission device which transmits a signal indicative of the current value of the matrix suction exhibited by the porous medium surrounding the sensor, either via a wired connection or wireless connection, to a remote display device which displays the indicator of the current value of the matrix suction exhibited by the porous medium surrounding the sensor.

15. The capacitive matrix suction sensor of claim 13, wherein the electronics module further establishes an indicator of whether liquid should be added to the porous medium surrounding the sensor based on the current value of the matrix suction exhibited by the porous medium surrounding the sensor.

16. A system for measuring the matrix suction of a porous medium, comprising:
 a capacitive matrix suction sensor which is inserted into the porous medium and which comprises,
 a capacitive moisture probe comprising a sensing body, and a jacket that encases the sensing body, said jacket being comprises of a hydrophilic, non-conductive, porous (HN-CP) material; and
 a matrix suction computing device, and a matrix suction computer program having a plurality of sub-programs executable by said matrix suction computing device, wherein the sub-programs configure said matrix suction computing device to, initiate a current to energize the sensing body of the capacitive matrix suction sensor, read a voltage caused by a capacitance of the HN-CP material of the jacket when the sensing body is energized,
 compute the matrix suction exhibited by the HN-CP material of the jacket based on the read voltage, a voltage-to-liquid content profile which defines the relationship between a voltage caused by the capacitance of the HN-CP material of the jacket when the sensing body is energized and the amount of liquid held within the HN-CP material and a known liquid-release curve which defines the relationship between the liquid content of the HN-CP material and the matrix suction of the material, and
 establish an indicator of the current value of the matrix suction exhibited by the porous medium in which the capacitive matrix suction sensor is inserted based on the matrix suction computed for the HN-CP material of the jacket.

17. The system of claim 16, wherein the sub-program for computing the matrix suction involves a two-step procedure comprising:
 computing the liquid content of the HN-CP material of the jacket based on the read voltage and the voltage-to-liquid content profile; and
 computing the matrix suction exhibited by the HN-CP material of the jacket based on the computed liquid content and the known liquid-release curve which defines the relationship between the liquid content of the HN-CP material and the matrix suction of the material.

* * * * *